United States Patent
Takayanagi (10) Patent No.: US 7,944,004 B2
(45) Date of Patent: May 17, 2011

(54) MULTIPLE THICKNESS AND/OR COMPOSITION HIGH-K GATE DIELECTRICS AND METHODS OF MAKING THEREOF

(75) Inventor: Mariko Takayanagi, Clifton Park, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 12/411,425

(22) Filed: Mar. 26, 2009

(65) Prior Publication Data

US 2010/0244207 A1   Sep. 30, 2010

(51) Int. Cl.
H01L 29/94   (2006.01)
H01L 21/336   (2006.01)

(52) U.S. Cl. ......... 257/406; 257/E29.133; 257/E21.625; 438/287

(58) Field of Classification Search ................ 438/287, 438/161; 257/406, E21.625, E29.133
See application file for complete search history.

(56) References Cited

U.S. PATENT DOCUMENTS

| | | | |
|---|---|---|---|
| 6,458,646 B1 * | 10/2002 | Divakaruni et al. | 438/241 |
| 6,670,248 B1 * | 12/2003 | Ang et al. | 438/287 |
| 6,756,635 B2 * | 6/2004 | Yasuda et al. | 257/325 |
| 6,787,421 B2 * | 9/2004 | Gilmer et al. | 438/275 |
| 7,226,830 B2 * | 6/2007 | Colombo et al. | 438/216 |
| 7,230,287 B2 * | 6/2007 | Anderson et al. | 257/213 |
| 7,344,934 B2 * | 3/2008 | Li | 438/199 |
| 7,524,707 B2 * | 4/2009 | Adetutu et al. | 438/150 |
| 2006/0043497 A1 | 3/2006 | Kimizuka et al. | |
| 2006/0131670 A1 | 6/2006 | Ogura et al. | |
| 2006/0145265 A1 | 7/2006 | Masuoka et al. | |
| 2006/0223266 A1 * | 10/2006 | Lim et al. | 438/275 |
| 2007/0158705 A1 | 7/2007 | Takayanagi | |
| 2007/0212896 A1 | 9/2007 | Olsen et al. | |
| 2007/0278593 A1 | 12/2007 | Watanabe | |
| 2008/0128797 A1 * | 6/2008 | Dyer et al. | 257/328 |
| 2009/0197387 A1 * | 8/2009 | Wong et al. | 438/400 |

OTHER PUBLICATIONS

Tsutsui et al, A Cost-Effective LOP/LSTP Integrated CMOS Platform Utilizing Multi-Thickness SiON Gate Dielectrics with Hafnium for 45-nm Node, 2007 Symposium on VLSI Technology Digest of Technical Papers.

Watanabe et al, Impact of Hf Concentration on Performance of Reliability for HfSiON-CMOSFET, IEEE, 2004.

* cited by examiner

Primary Examiner — W. David Coleman
(74) Attorney, Agent, or Firm — Turocy & Watson, LLP (57) ABSTRACT

Disclosed are methods of making an integrated circuit with multiple thickness and/or multiple composition high-K gate dielectric layers and integrated circuits containing multiple thickness and/or multiple composition high-K gate dielectrics. The methods involve forming a layer of high-K atoms over a conventional gate dielectric and heating the layer of high-K atoms to form a high-K gate dielectric layer. Methods of suppressing gate leakage current while mitigating mobility degradation are also described.

21 Claims, 6 Drawing Sheets

MULTIPLE THICKNESS AND/OR COMPOSITION HIGH-K GATE DIELECTRICS AND METHODS OF MAKING THEREOF

TECHNICAL FIELD

Described are methods of making multiple thickness and/or composition high-K gate dielectric layers, integrated circuits containing multiple thickness and/or composition high-K gate dielectrics, and other associated methods.

BACKGROUND

There is a continuing trend in the semiconductor industry to decrease the size of transistors in order to increase the performance and speed of a large-scale integrated circuit (LSI). Correspondingly, efforts to increase operation speeds of metal oxide semiconductor type field effect transistors (MOSFETs) include making the gate insulating film (typically containing silicon dioxide) thinner. For example, silicon dioxide gate insulating films with a thickness of 2 nm are available. While the relatively thin gate insulating films increase operation speeds, other problems are undesirably created.

In MOSFETs having a relatively thin gate insulating film, the amount of gate leakage current is deleteriously high, due to tunneling current. Gate leakage inhibits the performance of a microelectronic device. Power consumption of devices employing thin gate insulating film MOSFETs is an important concern due to gate leakage. In electronic devices, it is typically desirable to reduce the amount of power that is consumed by a microelectronic device. This is because in battery powered electronic devices it is typically desirable to reduce the amount of power consumed by the microelectronic device in order to extend the time the electrical device may be powered by a battery.

Attempts to address the gate leakage problem include use of high-K gate dielectrics, such as hafnium oxide. However, use of high-K gate dielectrics raises certain issues including mobility degradation, introduction of a high number of traps (thereby decreasing reliability), and relatively high noise (1/f noise) compared to silicon dioxide. Mobility degradation leads to poor transistor drive current. Moreover, mobility degradation contravenes an important scaling goal of improved mobility. The degradation of mobility can at least be partially attributable to localized charge traps.

Another issue with high-K gate dielectrics, such as hafnium oxide, is the difficulty associated with patterning. In many instances, a strong acid is required. The strong acid desirably removes portions of the high-K dielectric, but undesirably removes many other semiconductor device materials including silicon dioxide. Since silicon dioxide is extensively used in microelectronic devices, use of strong acids is disfavored. Consequently, to avoid serious damage the use of strong acids is avoided.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

One aspect of the invention relates to methods of making an integrated circuit with multiple thickness and/or multiple composition high-K gate dielectric layers involving forming a conventional gate dielectric layer having multiple-thicknesses; forming a layer of high-K atoms over the conventional gate dielectric; and heating the structure to form a high-K gate dielectric layer having multiple thicknesses and/or multiple compositions.

Another aspect of the invention relates to integrated circuits containing a first set of transistors over a first portion of a substrate, a second set of transistors over a second portion of the substrate; the first set of transistors comprising a high-K gate dielectric of a first thickness and/or first composition, and the second set of transistors comprising a high-K gate dielectric of a second thickness, the first thickness greater than the second thickness and/or second composition.

Yet another aspect of the invention relates to methods of suppressing gate leakage current while simultaneously mitigating mobility degradation involving using the integrated circuits containing multiple-thickness and/or multiple composition high-K gate dielectrics.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Making semiconductor structures with multiple thickness high-K gate dielectrics and/or high-K gate dielectrics with different compositions (varying amounts of high-K atoms) is described herein. Providing high-K gate dielectrics with different thicknesses and different compositions enables one to tailor a given high-K gate dielectric to a specific type of microelectronic device or transistor. Both the thickness and composition of the high-K gate dielectrics may be controlled. For example, in a logic LSI device, core logic transistors may require a thinner high-K gate dielectric having a higher dielectric constant than I/O transistors that require a relatively thick high-K gate dielectric having a relatively low dielectric constant.

Given the difficulties associated with patterning high-K gate dielectrics, methods of making multiple thickness high-K gate dielectrics without the need for patterning the high-K gate dielectrics are described herein. Making multiple thickness high-K gate dielectrics without patterning the high-K gate dielectrics enables the fabrication of microelectronic devices without damage (particularly without damage to silicon dioxide portions of the microelectronic device). Eliminating acts associated with patterning also decreases costs required to make the microelectronic devices.

High-K gate dielectrics have a dielectric constant greater than silicon dioxide. In another embodiment, high-K gate dielectrics have a dielectric constant greater than about 10. High-K gate dielectrics have at least one high-K atom that contributes to the high-K properties of the high-K gate dielectrics. In one embodiment, the High-K gate dielectrics have at least two high-K atoms that contribute to the high-K properties of the high-K gate dielectrics. General examples of high-K atoms include elements of Group IVA of the Periodic Table and elements from the Lanthanide Series of the Periodic Table. Specific examples of high-K atoms include zirconium, hafnium, lanthanum, and gadolinium.

The composition of the high-K gate dielectrics can be represented by one or more of the following chemical formulae:

MSiO

MSiON $M^1M^2SiO$ $M_xSi_{1-x}O_2$ $M_xSi_{1-x}ON$ wherein M, $M^1$ and $M^2$ are independently an element of Group IVA or an element from the Lanthanide Series; $M^2$ is nitrogen, an element of Group IVA, or an element from the Lanthanide Series; and x is less than 1 and greater than 0. Specific examples include $Hf_xSi_{1-x}O_2$, $Hf_xSi_{1-x}ON$, $Zr_xSi_{1-x}O_2$, $Zr_xSi_{1-x}ON$, $La_xSi_{1-x}O_2$, $La_xSi_{1-x}ON$, $Gd_xSi_{1-x}O_2$, $Gd_xSi_{1-x}ON$, HfZrSiO, HfZrSiON, HfLaSiO, and HfGdSiO, where x is between 0 and 1. In some instances, numerical subscripts are not shown since the amount of each atom may vary depending upon a number of factors described later (thus when not shown, the subscript may be any number).

The high-K gate dielectrics optionally have a supplemental high-K atom that when present with the high-K atom(s) further contributes to the high-K properties of the high-K gate dielectrics. An example of a supplemental high-K atom is nitrogen.

The high-K gate dielectrics are made by subjecting a stack of a layer of high-K atoms over a conventional gate dielectric layer to a heat treatment. The heat treatment induces the high-K atoms to penetrate into the conventional gate dielectric layer, where new chemical bonds between and/or amongst the high-K atoms, silicon, oxygen, and/or nitrogen are formed, thereby creating the high-K gate dielectric layer. High-K gate dielectric layers have different high-K atom content (in other words, different compositions), depending upon the thicknesses of the layer of high-K atoms and the conventional gate dielectric layer. By varying the high-K atom content in high-K gate dielectric layers, high-K gate dielectric layers having different dielectric constants can be made.

High-K gate dielectric layers of different compositions can be advantageously made on one substrate by varying the thicknesses of at least one of the layer of high-K atoms and the conventional gate dielectric layer. For example, a graphical illustration of three distinct high-K gate dielectric layers having different compositions is reported in FIG. 1. A structure represented in FIG. 8 (which is discussed below) was made using hafnium as the high-K atoms and silicon dioxide as the conventional gate dielectric layer and tested to obtain the variable content data.

Figure 1:
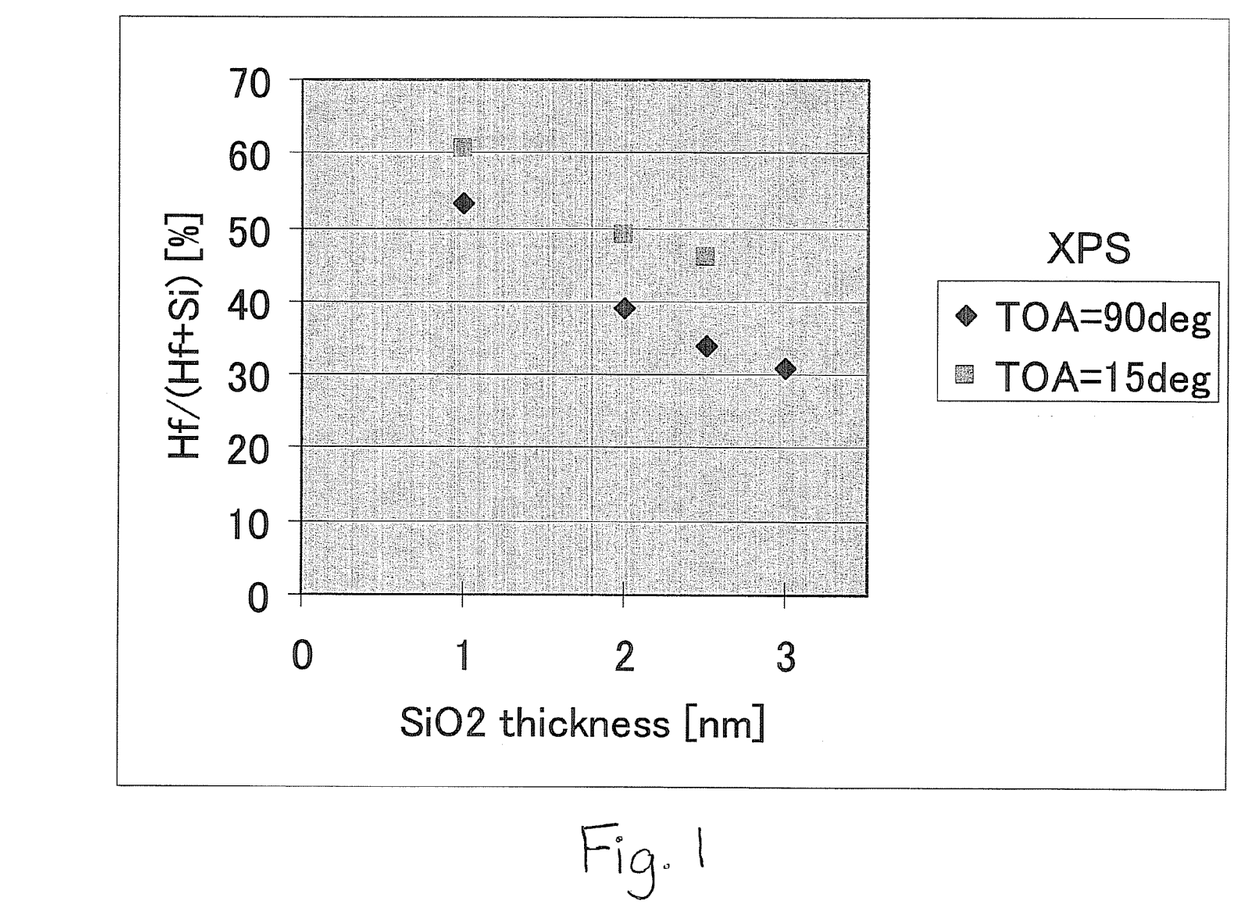
FIG. 1 is a graph showing the relationship between the thickness of a conventional gate dielectric layer versus the content ratio of high-K atoms in the high-K gate dielectrics and the stack of high-K gate dielectrics over conventional gate dielectric layers.

The graph in FIG. 1 plots the thickness of silicon dioxide versus the content ratio of hafnium over hafnium and silicon. The graph in FIG. 1 demonstrates that three different compositions of $Hf_xSi_{1-x}O_2$ are obtained when using three different thicknesses of silicon dioxide. The squares represent the percent hafnium in the high-K gate dielectric layers while the diamonds represent the percent hafnium in the high-K gate dielectric layers and silicon dioxide layers.

Figure 2:
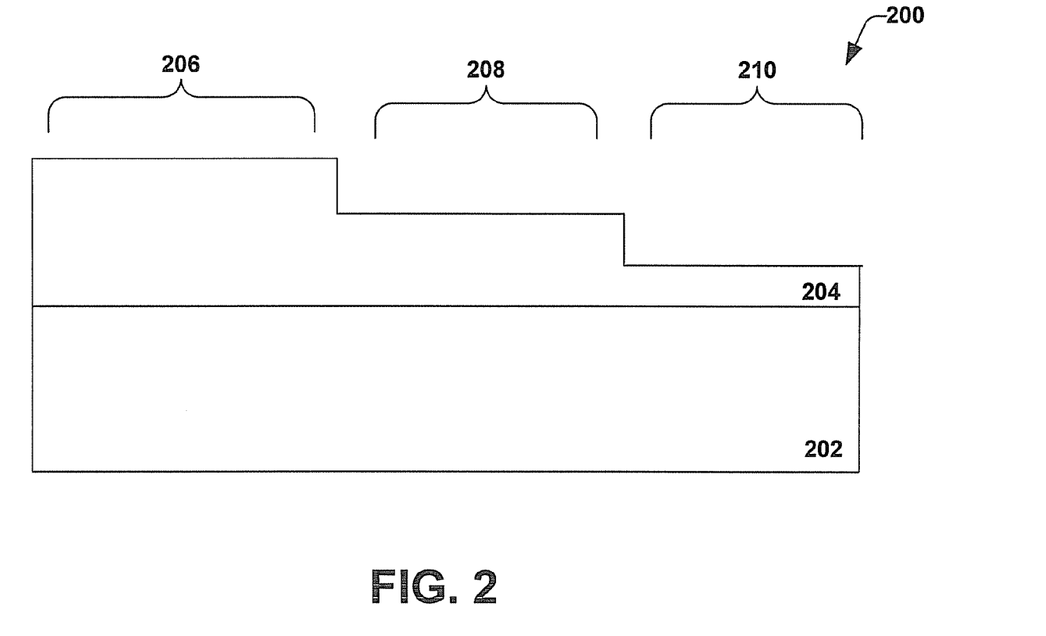
FIG. 2 is a cross-sectional view of a structure involved in making multiple thickness and/or multiple composition high-K gate dielectrics in accordance with an aspect of the invention.

Referring to FIG. 2, structure 200 with a multi-thickness conventional gate dielectric layer 204 is provided over a semiconductor substrate 202. Any substrate may be employed. Examples of semiconductor substrates include wafers, silicon such as single crystal silicon, germanium, silicon on insulator (SOI), silicon carbide (SiC), doped silicon, III-V materials such as gallium arsenide (GaAs) or indium phosphide (InP), and the like. The substrate may optionally already have any number of structures thereon.

The multi-thickness conventional gate dielectric layer 204 has at least three areas of different thickness; namely a first relatively thick portion 206, second middle-sized portion 208, and a third relatively thin portion 210. The first relatively thick portion 206, the second middle-sized portion 208, and the third relatively thin portion 210 subsequently support microelectronic devices such as transistors with different gate dielectric thicknesses. Although not shown, the multi-thickness conventional gate dielectric layer 204 can have four or more thicknesses, five or thicknesses, six or more thicknesses, and so on.

The multi-thickness conventional gate dielectric layer 204 can be formed in any suitable manner. Conventional gate dielectrics, for purposes herein, include silicon dioxide and silicon oxynitride. When the multi-thickness conventional gate dielectric layer 204 contains silicon dioxide, formation techniques include deposition techniques (for example, chemical vapor deposition (CVD) including low pressure CVD and plasma enhanced CVD) and growth techniques (for example, thermal oxide growth). When the multi-thickness conventional gate dielectric layer 204 contains silicon oxynitride, formation techniques typically include deposition techniques such as CVD. The various thicknesses of the multi-thickness conventional gate dielectric layer 204 are determined, in part, by the desired resultant thicknesses of the resultant high-K gate dielectrics.

Although not shown, one exemplary method of forming the multi-thickness conventional gate dielectric layer 204 involves initially forming a layer of a conventional gate dielectric having a first thickness over the substrate, then patterning a resist so that the patterned resist covers portions of the conventional gate dielectric layer that subsequently form the first relatively thick portion 206, while other portions of the conventional gate dielectric layer are exposed. The exposed portions of the conventional gate dielectric layer are removed exposing portions of the substrate, by etching for example, and the patterned resist is then stripped. Another layer of a conventional gate dielectric having a second thickness (typically less than the first thickness) is formed over the exposed portions of the substrate, and another resist is patterned so that the patterned resist covers portions of the conventional gate dielectric layer that subsequently form the first relatively thick portion 206 and the second middle-sized portion 208, while other portions of the conventional gate dielectric layer are exposed. The exposed portions of the conventional gate dielectric layer are removed exposing portions of the substrate and the patterned resist is then stripped. Yet another layer of a conventional gate dielectric having a third thickness (typically less than both the first and second thicknesses) is formed over the exposed portions of the substrate, and yet another resist is patterned so that the patterned resist covers portions of the conventional gate dielectric layer that subsequently form the first relatively thick portion 206, the second middle-sized portion 208, and the third relatively thin portion 210 while other portions of the conventional gate dielectric layer are exposed. The exposed portions of the conventional gate dielectric layer are removed exposing portions of the substrate and the patterned resist is then stripped.

Figure 3:
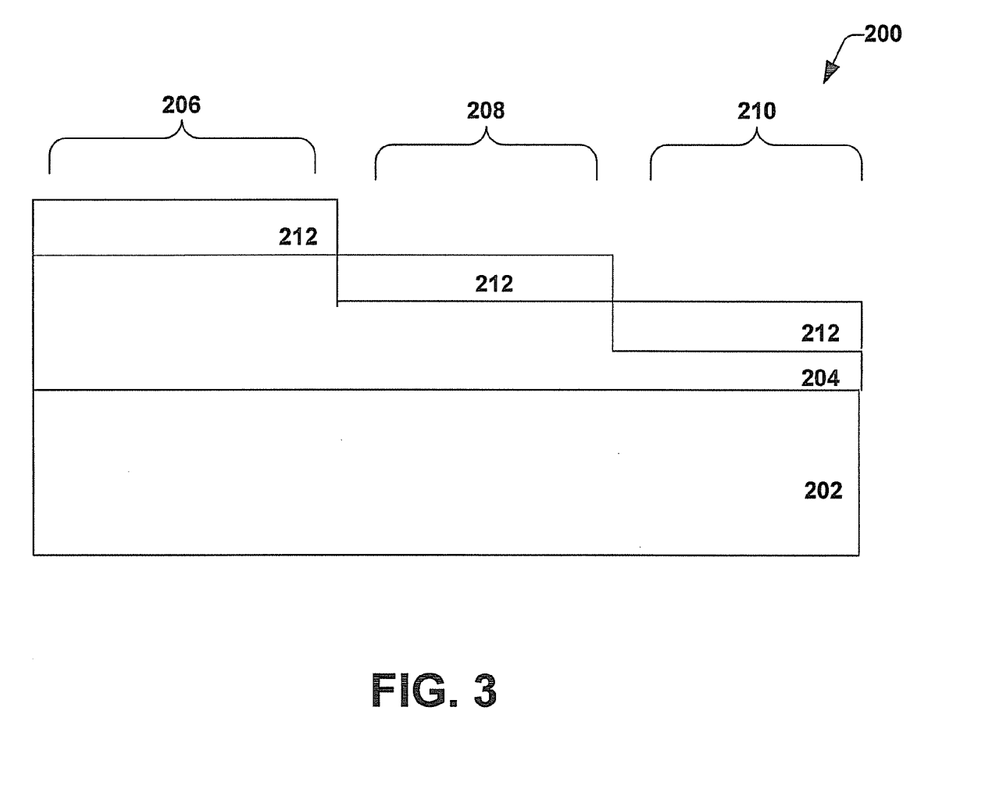
FIG. 3 is a cross-sectional view of another structure involved in making multiple thickness and/or multiple composition high-K gate dielectrics in accordance with an aspect of the invention.

Referring to FIG. 3, a layer of high-K atoms 212 is formed over the structure 200 in all portions where high-k gate dielectrics are desired. The layer of high-K atoms 212 may have a uniform thickness or varying thickness across the structure 200, but typically a substantially uniform thickness is formed. The layer of high-K atoms 212 is formed by sputtering, physical vapor deposition, evaporative deposition, electron beam physical vapor deposition, cathodic arc deposition, pulsed laser deposition, or the like (collectively referred to as physical vapor deposition). Use of sputtering and physical vapor deposition inhibits the formation of bonds between the high-K atoms and components of the conventional gate dielectric layer 204.

The thickness of the layer of high-K atoms 212 is suitable to contribute to the formation of high-k gate dielectrics of different thicknesses that suppress gate leakage current while inhibiting mobility degradation. In one embodiment, the thickness of the layer of high-K atoms is from about 0.1 nm to about 25 nm. In another embodiment, the thickness of the layer of high-K atoms is from about 0.2 nm to about 20 nm. In yet another embodiment, the thickness of the layer of high-K atoms is from about 0.3 nm to about 10 nm.

Figure 4:
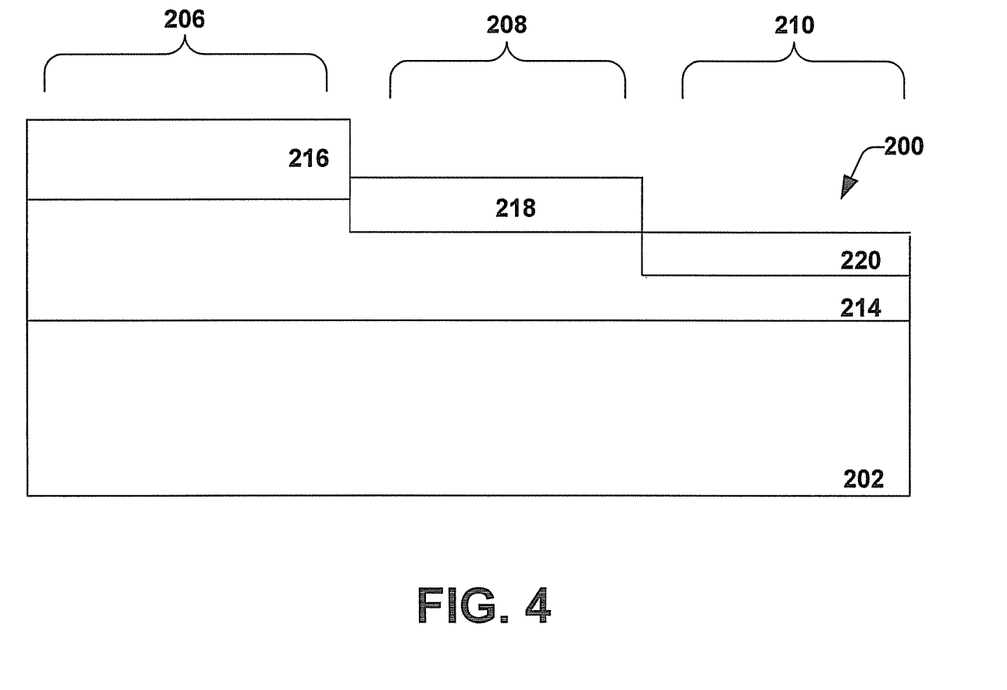
FIG. 4 is a cross-sectional view of yet another structure involved in making multiple thickness and/or multiple composition high-K gate dielectrics in accordance with an aspect of the invention.

Referring to FIG. 4, the structure 200 is subjected to a heat treatment which drives the high-K atoms of the layer of high-K atoms 212 into the conventional gate dielectric layer 204. When the high-K atoms penetrate into the conventional gate dielectric layer 204, new chemical bonds between and/or amongst the high-K atoms, silicon, oxygen, and/or nitrogen are formed, creating the high-K gate dielectric layers 216, 218, and 220. The high-K gate dielectric layers 216, 218, and 220 have different thicknesses depending upon a number of factors. The high-K gate dielectric layers 216, 218, and 220 have different compositions (varying amounts of the high-K atom therein) depending upon a number of factors. Since at least a portion of the conventional gate dielectric layer 204 is converted into the high-K gate dielectric layers 216, 218, and 220, the remaining portion of the conventional gate dielectric layer 214 remains under the high-K gate dielectric layers 216, 218, and 220 and over the substrate 202.

Although the remaining portion of the conventional gate dielectric layer 214 is shown, it is possible in some instances to completely consume the conventional gate dielectric layer 214 when forming the high-K gate dielectric layers 216, 218, and 220 so that there is no remaining portion of the conventional gate dielectric layer 214 under one or more of portions 206, 208, and 210 (not shown). In other words, the conventional gate dielectric may or may not be present between the high-K gate dielectric layer and the substrate (channel region), depending on the extent of the annealing.

The heat treatment is conducted at a temperature sufficient to lead to the yield high-K gate dielectrics of different thicknesses and different compositions that suppress gate leakage current while inhibiting mobility degradation. In one embodiment, heat treatment is conducted at a temperature from about 800° C. to about 1200° C. In another embodiment, heat treatment is conducted at a temperature from about 850° C. to about 1100° C. In yet another embodiment, heat treatment is conducted at a temperature from about 900° C. to about 1050° C.

The heat treatment is conducted for a sufficient time to lead to the yield high-K gate dielectrics of different thicknesses and different compositions that suppress gate leakage current while inhibiting mobility degradation. In one embodiment, heat treatment is conducted for a time from about 1 second to about 5 minutes. In another embodiment, heat treatment is conducted for a time from about 5 seconds to about 2 minutes. In yet another embodiment, heat treatment is conducted for a time from about 10 seconds to about 1 minute.

The heat treatment is conducted at a sufficient pressure to lead to the yield high-K gate dielectrics of different thicknesses and different compositions that suppress gate leakage current while inhibiting mobility degradation. In one embodiment, the heat treatment is conducted at a pressure from about 0 atmospheres to about 1.2 atmospheres. In another embodiment, the heat treatment is conducted at a pressure from about 0.1 atmospheres to about 1 atmosphere.

The atmosphere in which the heat treatment or annealing is conducted can include one or more of a vacuum, an inert gas such as nitrogen or the noble gases including helium, neon, argon, or xenon, or oxygen. When the heat treatment atmosphere contains oxygen, reduced pressures (such as less than about 0.5 atmospheres) are often employed.

By employing relatively longer annealing times and/or relatively lower annealing temperatures, deeper high-K atom penetration occurs thereby increasing the thickness of the resultant high-K gate dielectric (compared to relatively shorter annealing times and/or relatively higher annealing temperatures that lessens the penetration depth of the high-K atoms leaving a relatively thin high-K gate dielectric). For example, annealing at about 950° C. for about 50 seconds can drive hafnium deeper into silicon dioxide than annealing at about 1000° C. for about 20 seconds. The relatively longer annealing times and/or relatively lower annealing temperatures also increases the thickness difference among the multiple thickness high-K gate dielectrics. Regardless of the resultant thickness of the high-K gate dielectric, electrical properties similar to those of silicon dioxide are obtainable.

Conventional techniques for making high-k dielectrics present concerns. For example, high-K dielectrics are typically made using CVD or atomic layer deposition (ALD) techniques that tend to cause incorporation of carbon containing precursor materials and/or other contaminants into the high-K dielectric. The carbon and other contaminants adversely affect the dielectric properties of the high-K gate dielectric. Also, the quality of the interface between a CVD or ALD deposited high-K film and the channel region is not as robust as the interface between a silicon dioxide layer and the channel region.

Furthermore, when making high-k dielectrics using CVD, the high-K atom is bonded to other atoms, such as for example silicon and/or oxygen. Thus, the chemical structure is formed, and the formed structure is difficult to reform (thus difficult to tailor the composition via annealing which in turn enables tuning the material to achieve desired properties). Thus, the high-k gate dielectrics described herein are not made using CVD to deposit the high-K atoms.

The conventional gate dielectric may or may not be present between the high-K gate dielectric and the substrate (channel region), depending on the extent of the annealing. If present, in one embodiment, the thickness of the conventional gate dielectric is from about 0.1 nm to about 25 nm. If present, in another embodiment, the thickness of the conventional gate dielectric is from about 0.2 nm to about 10 nm.

Generally speaking, the high-K gate dielectric layer 216 formed in the first relatively thick portion 206 of the conventional gate dielectric is has a thickness greater than both the thickness of the high-K gate dielectric layer 218 formed in the second middle-sized portion 208 of the conventional gate dielectric and the thickness of the high-K gate dielectric layer 220 formed in the third relatively thin portion 210 of the conventional gate dielectric of the structure 200. This is because, in part, of the presence of a thicker conventional gate dielectric layer 204 through which the high-K atoms can penetrate during the heat treatment. The thickness of the high-K gate dielectric layers 216, 218, and 220 and the different portions of the remaining portion of the conventional gate dielectric layer 214 generally corresponds with the thicknesses of the high-K gate dielectrics and the conventional gate dielectrics in the microelectronic devices shown in FIG. 5. However, it is understood that the high-K gate dielectric layers 216, 218, and 220 and the different portions of the remaining portion of the conventional gate dielectric layer 214 can be modified before completion of the microelectronic devices shown in FIG. 5.

Figure 5:
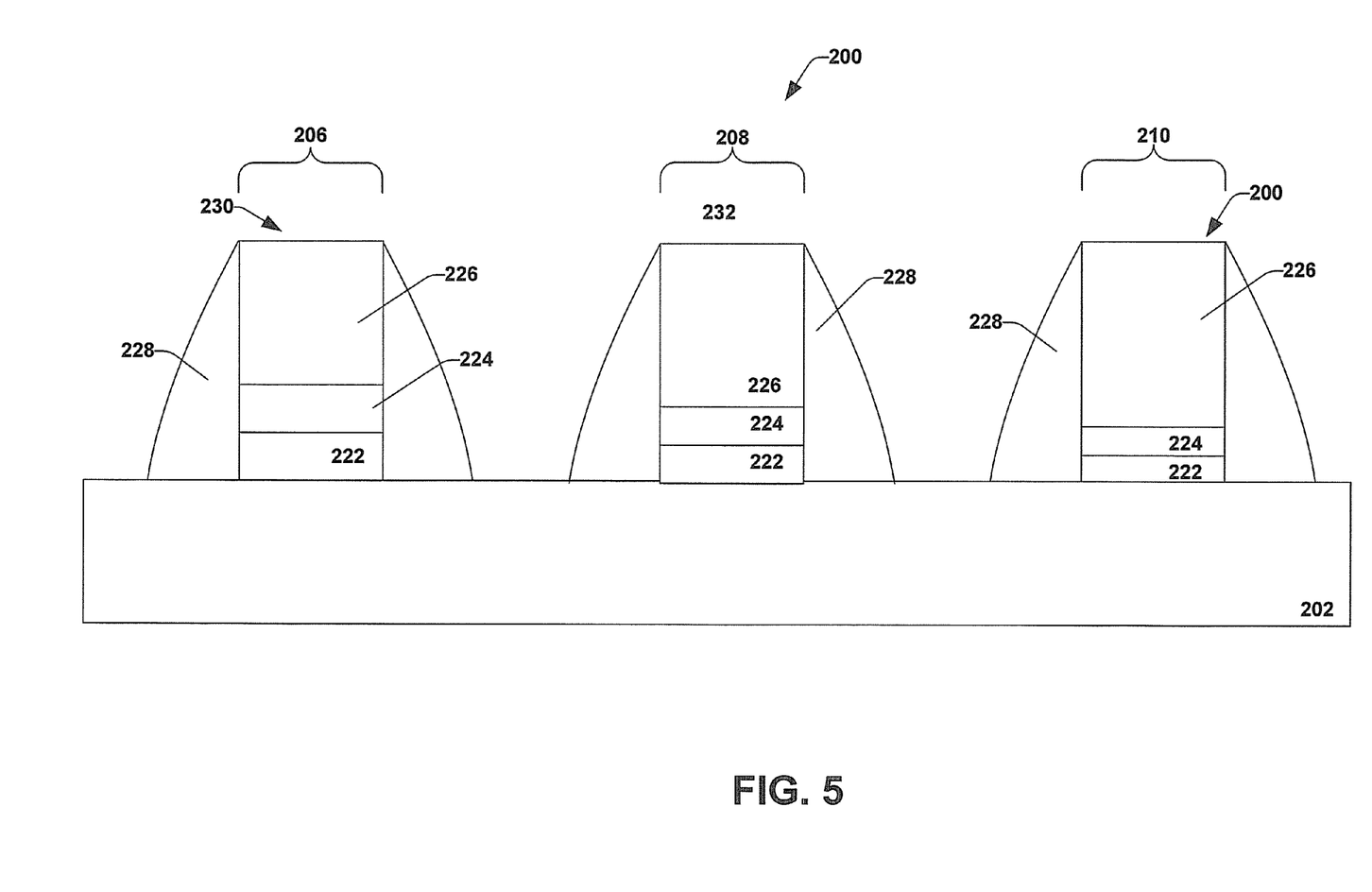
FIG. 5 is a cross-sectional view of a structure containing multiple thickness and/or multiple composition high-K gate dielectrics in accordance with an aspect of the invention.

Specifically referring to FIG. 5, using standard techniques, microelectronic devices 230, 232, and 234 are formed. The microelectronic devices 230, 232, and 234 can be transistors and contain an optional conventional gate dielectric 222, a high-K gate dielectric 224, a polysilicon layer 226, and spacers 228. Other structures are possible (such as duel gate non-volatile memory cell transistors). The only requirement of such other structures is that they contain a gate dielectric.

The microelectronic devices 230 formed where the first relatively thick portion 206 of the conventional gate dielectric originally was formed has a high-K gate dielectric 224 thickness greater than the thickness of the high-K gate dielectric 224 of the microelectronic devices 232 and 234 formed where the second middle-sized portion 208 and third relatively thin portion 210 of the conventional gate dielectric originally were formed. The microelectronic devices 232 formed where the second middle-sized portion 208 of the conventional gate dielectric originally was formed has a high-K gate dielectric 224 thickness greater than the thickness of the high-K gate dielectric 224 of the microelectronic devices 234 formed where the third relatively thin portion 210 of the conventional gate dielectric layer originally was formed.

The thickness of the high-K gate dielectrics is sufficient to mitigate gate leakage current while inhibiting mobility degradation. In one embodiment, the thickness of the multiple high-K gate dielectrics (or the high-K gate dielectric layers) is independently from about 0.25 nm to about 20 nm. In another embodiment, the thickness of the multiple high-K gate dielectrics is independently from about 0.5 nm to about 10 nm. In yet another embodiment, the thickness of the multiple high-K gate dielectrics (or the high-K gate dielectric layers) is independently from about 0.75 nm to about 5 nm.

The difference in thickness between any two sets of high-K gate dielectrics (or the difference in thickness between any two sets of high-K gate dielectric layers) is sufficient to contribute to imparting different properties to the respective sets of high-K gate dielectrics. In one embodiment, the difference in thickness between any two sets of high-K gate dielectrics (for example, between the thickest high-K gate dielectric and the thinnest high-K gate dielectric, or between the thickest high-K gate dielectric and the middle-sized high-K gate dielectric, or between the middle-sized high-K gate dielectric and the thinnest high-K gate dielectric, and so on) is at least about 0.1 nm. In another embodiment, the difference in thickness between any two sets of high-K gate dielectrics is at least about 0.25 nm. In yet another embodiment, the difference in thickness between any two sets of high-K gate dielectrics is at least about 0.5 nm.

Similarly, the difference in thickness between any two sets of conventional gate dielectrics underneath corresponding high-K gate dielectrics is sufficient to contribute to imparting different properties to the respective sets of high-K gate dielectrics. In one embodiment, the difference in thickness between any two sets of conventional gate dielectrics if present (for example, between the thickest conventional gate dielectric and the thinnest conventional gate dielectric, or between the thickest conventional gate dielectric and the middle-sized conventional gate dielectric, or between the middle-sized conventional gate dielectric and the thinnest high-K gate dielectric, and so on) is at least about 0.1 nm. In another embodiment, the difference in thickness between any two sets of conventional gate dielectrics is at least about 0.25 nm. In yet another embodiment, the difference in thickness between any two sets of conventional gate dielectrics is at least about 0.25 nm.

The microelectronic devices 230 can also have a conventional gate dielectric 222 with a thickness greater than the thickness of the conventional gate dielectric 222 of the microelectronic devices 232 and 234. And the microelectronic devices 232 can have a conventional gate dielectric 222 with a thickness greater than the thickness of the conventional gate dielectric 222 of the microelectronic devices 234.

By varying one or more of the annealing time, the annealing temperature, the annealing pressure, the annealing atmosphere composition, the identity of the high-K atom(s), the amount of high-K atom(s) deposited over the conventional gate material, and the specific type of conventional gate material, it is possible to control the depth of the high-K atom penetration, thereby controlling the thickness of the resultant high-K gate dielectric.

Also, by varying one or more of the annealing time, the annealing temperature, the annealing pressure, the annealing atmosphere composition, the identity of the high-K atom(s), the amount of high-K atom(s) deposited over the conventional gate material, and the specific type of conventional gate material, it is possible to control the composition of the resultant high-K gate dielectric, thereby controlling the properties of the resultant high-K gate dielectric. One particular advantage is that it is often desirable to minimize the amount of high-K atom(s) in the resultant high-K gate dielectric.

For example, when forming three high-K gate dielectrics of different thicknesses, such as those shown in FIG. 5, when the high-K atom is hafnium and $Hf_xSi_{1-x}O_2$ is the high-K gate dielectric material formed, x of $Hf_xSi_{1-x}O_2$ in microelectronic device 230 is less than x of $Hf_xSi_{1-x}O_2$ in microelectronic device 232, which in turn is less than x of $Hf_xSi_{1-x}O_2$ in microelectronic device 234.

Specifically, in some instances, some high-K gate dielectrics, such as HfSiON, are susceptible to trap-related leakage currents. The trap-related leakage currents tend to increase with stress over the lifetime of a microelectronic device. Generally, the higher the high-K atom concentration, the more severe the issue becomes. In this context, the ability to control the high-K atom concentration in a high-K dielectric, as described herein, presents a significant advantage in making durable, robust microelectronic devices.

Another series of structures are described in FIGS. 6-9. Various features, such as identity of materials, thickness parameters, and the like, are the same or similar to those of the structures described in FIGS. 2-5 and thus are not repeated for brevity.

Figure 6:
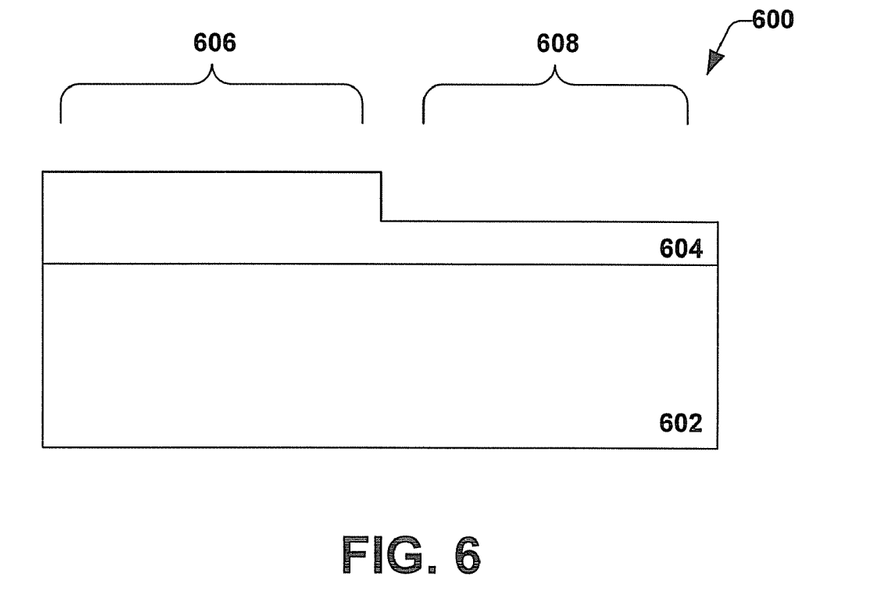
FIG. 6 is a cross-sectional view of a structure involved in making multiple thickness and/or multiple composition high-K gate dielectrics in accordance with an aspect of the invention.

Referring to FIG. 6, structure 600 with a multi-thickness conventional gate dielectric layer 604 is provided over a semiconductor substrate 602. Any substrate may be employed. The substrate may optionally already have any number of structures thereon.

The multi-thickness conventional gate dielectric layer 604 has at least two areas of different thickness; namely a first relatively thick portion 606 and a second relatively thin portion 608. The first relatively thick portion 606 and a second relatively thin portion 608 subsequently support microelectronic devices such as transistors with different gate dielectric thicknesses. Although not shown, the multi-thickness conventional gate dielectric layer 604 can have three or more thicknesses, four or more thicknesses, five or thicknesses, six or more thicknesses, and so on.

The multi-thickness conventional gate dielectric layer 604 can be formed in any suitable manner. The various thicknesses of the multi-thickness conventional gate dielectric layer 604 are determined, in part, by the desired resultant thicknesses of the high-K gate dielectrics.

Although not shown, one exemplary method of forming the multi-thickness conventional gate dielectric layer 604 involves initially forming a layer of a conventional gate dielectric having a first thickness over the substrate, then patterning a resist so that the patterned resist covers portions of the conventional gate dielectric that subsequently form the first relatively thick portion 106, while other portions of the conventional gate dielectric layer are exposed. The exposed portions of the conventional gate dielectric layer are removed exposing portions of the substrate, by etching for example, and the patterned resist is then stripped. Another layer of a conventional gate dielectric having a second thickness (typically less than the first thickness) is formed over the exposed portions of the substrate, and another resist is patterned so that the patterned resist covers portions of the conventional gate dielectric layer that subsequently form the first relatively thick portion 606 and the second relatively thin portion 108, while other portions of the conventional gate dielectric layer are exposed. The exposed portions of the conventional gate dielectric layer are removed exposing portions of the substrate and the patterned resist is then stripped.

Figure 7:
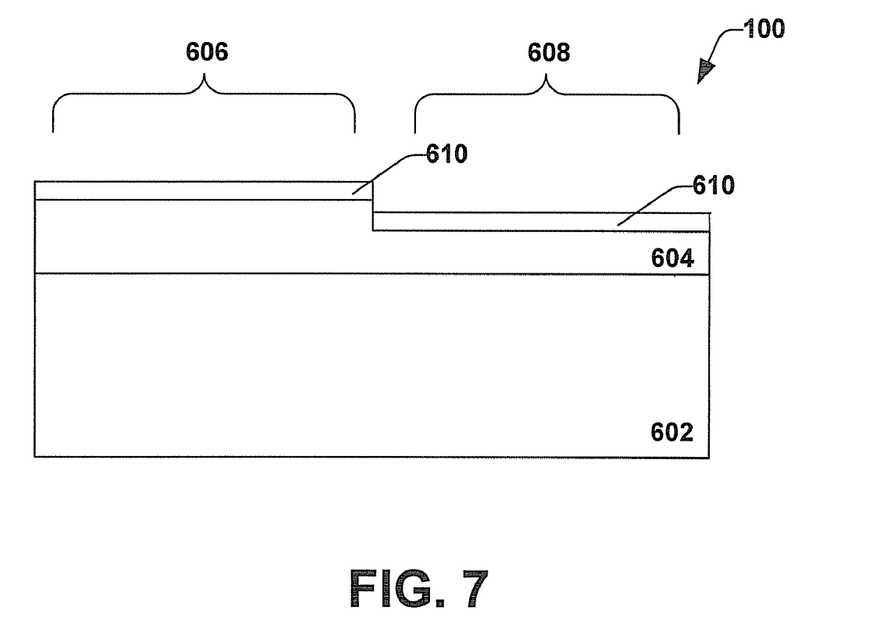
FIG. 7 is a cross-sectional view of another structure involved in making multiple thickness and/or multiple composition high-K gate dielectrics in accordance with an aspect of the invention.

Referring to FIG. 7, a layer of high-K atoms 610 is formed over the structure 600 in all portions where a high-k gate dielectric is desired. The layer of high-K atoms 610 may have a uniform thickness or varying thickness across the structure 600, but typically a substantially uniform thickness is formed. The layer of high-K atoms 610 is formed by sputtering, physical vapor deposition, evaporative deposition, electron beam physical vapor deposition, cathodic arc deposition, pulsed laser deposition, or the like. Use of sputtering and physical vapor deposition inhibits the formation of bonds between the high-K atoms and components of the conventional gate dielectric layer 604.

The thickness of the layer of high-K atoms 610 is suitable to contribute to the formation of high-k gate dielectrics of different thicknesses that suppress gate leakage current while inhibiting mobility degradation.

Figure 8:
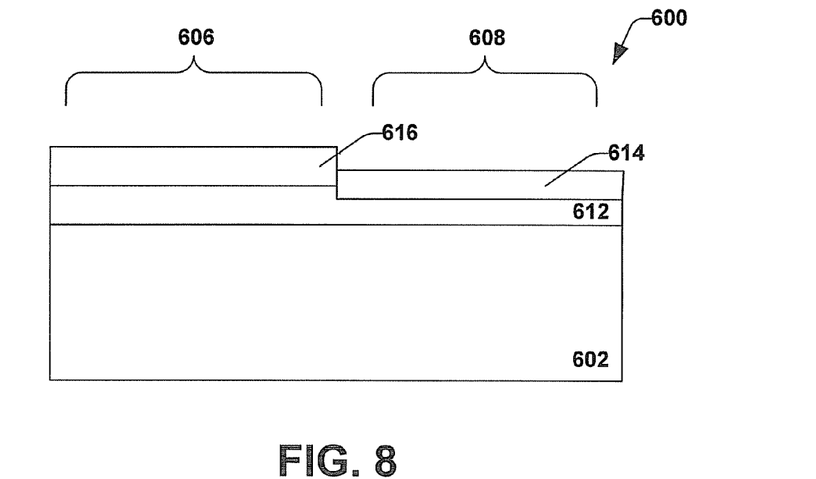
FIG. 8 is a cross-sectional view of yet another structure involved in making multiple thickness and/or multiple composition high-K gate dielectrics in accordance with an aspect of the invention.

Referring to FIG. 8, the structure is subjected to a heat treatment which drives the high-K atoms of the layer of high-K atoms 610 into the conventional gate dielectric layer 604. When the high-K atoms penetrate into the conventional gate dielectric layer 604, new chemical bonds between and/or amongst the high-K atoms, silicon, oxygen, and/or nitrogen are formed, creating the high-K gate dielectric layers 614 and 616. The high-K gate dielectric layers 614 and 616 have different thicknesses depending upon a number of factors. The high-K gate dielectric layers 614 and 616 also have different compositions (different amounts of the high-K atoms therein) depending upon a number of factors. Since at least a portion of the conventional gate dielectric layer 604 is converted into the high-K gate dielectric layers 614 and 616, the remaining portion of the conventional gate dielectric layer 612 remains under the high-K gate dielectric layers 614 and 616 and over the substrate 602. Although the remaining portion of the conventional gate dielectric layer 612 is shown, it is possible in some instances to completely consume the conventional gate dielectric layer 604 when forming the high-K gate dielectric layers 614 and 616 so that there is no remaining portion of the conventional gate dielectric layer 612 (not shown).

Generally speaking, the high-K gate dielectric layer 616 formed in the first relatively thick portion 606 of the conventional gate dielectric is has a thickness greater than the thickness of the high-K gate dielectric layer 614 formed in the second relatively thin portion 608 of the conventional gate dielectric of the structure 600. This is because, in part, of the presence of a thicker conventional gate dielectric layer 604 through which the high-K atoms can penetrate during the heat treatment. The thickness of the high-K gate dielectric layers 614 and 616 and the different portions of the remaining portion of the conventional gate dielectric layer 612 generally corresponds with the thicknesses of the high-K gate dielectrics and the conventional gate dielectrics in the microelectronic devices shown in FIG. 8. However, it is understood that the high-K gate dielectric layers 614 and 616 and the different portions of the remaining portion of the conventional gate dielectric layer 612 can be modified before completion of the microelectronic devices shown in FIG. 9.

Figure 9:
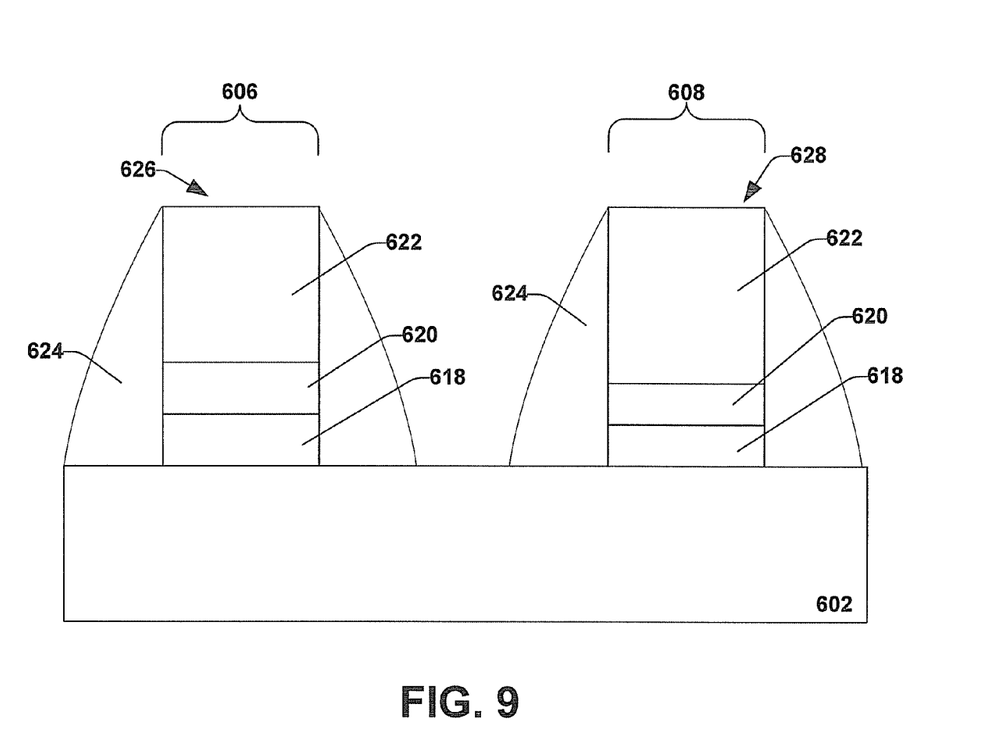
FIG. 9 is a cross-sectional view of a structure containing multiple thickness and/or multiple composition high-K gate dielectrics in accordance with an aspect of the invention.

Specifically referring to FIG. 9, using standard techniques, microelectronic devices 626 and 628 are formed. The microelectronic devices 626 and 628 can be transistors and contain an optional conventional gate dielectric 618, a high-K gate dielectric 620, a gate 622 such as a metal layer or polysilicon layer, and spacers 624 such as silicon nitride. Other structures are possible (such as duel gate non-volatile memory cell transistors). The only requirement of such other structures is that they contain a gate dielectric.

The microelectronic devices 626 formed where the first relatively thick portion 106 of the conventional gate dielectric originally was formed has a high-K gate dielectric 620 thickness greater than the thickness of the high-K gate dielectric 620 of the microelectronic devices 628 formed where the second relatively thin portion 608 of the conventional gate dielectric originally was formed. The microelectronic devices 626 can also have a conventional gate dielectric 618 with a thickness greater than the thickness of the conventional gate dielectric 618 of the microelectronic devices 626.

The methods of making high-K gate dielectrics can be applied to any type of microelectronic devices including CMOS transistors (complimentary metal oxide semiconductor), NMOS transistors (negative channel metal oxide semiconductor), PMOS transistors (positive channel metal oxide semiconductor) transistors, core logic transistors including LOP transistors and LSTP transistors, I/O transistors, nonvolatile memory cell transistors, transistors on any of RAM, flash, DRAM, SRAM, SDRAM, FRAM, MRAM, ROM, PROM, EPROM, EEPROM, CPU, LSI, VLSI, ASIC, FPGA, DSP, and the like. That is, the methods of making high-K gate dielectrics can be applied to any type of integrated circuit (IC) chip/chip set containing microelectronic devices.

With respect to any figure or numerical range for a given characteristic, a figure or a parameter from one range may be combined with another figure or a parameter from a different range for the same characteristic to generate a numerical range.

While the invention has been explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A method of making an integrated circuit with at least one of multiple thickness high-K gate dielectric layers or multiple composition high-K gate dielectric layers, comprising:
   forming a conventional gate dielectric layer having a first thickness in a first portion of a substrate and a second thickness in a second portion of the substrate, the first thickness greater than the second thickness;
   forming a layer of high-K atoms over the conventional gate dielectric;
   heating the layer of high-K atoms, the conventional gate dielectric layer, and the substrate to form a high-K gate dielectric layer, the high-K gate dielectric layer having at least one of a first thickness or a first composition in the first portion and at least one of a second thickness or a second composition in the second portion, the first thickness greater than the second thickness.

2. The method of claim 1, further comprising:
   forming a first set of transistors in the first portion of the substrate and a second set of transistors in the second portion of the substrate, the first set of transistors comprising a high-K gate dielectric of at least one a first thickness or a first composition and the second set of transistors comprising a high-K gate dielectric of at least one of a second thickness or a second composition, the first thickness greater than the second thickness and the first composition different from the second composition.

3. The method of claim 1, wherein forming the layer of high-K atoms comprises sputtering, physical vapor deposition, evaporative deposition, electron beam physical vapor deposition, cathodic arc deposition, or pulsed laser deposition.

4. The method of claim 1, wherein heating is conducted at a temperature from about 800° C. to about 1200° C. for a time from about 1 second to about 5 minutes.

5. The method of claim 1, wherein forming the layer of high-K atoms comprises sputtering one or more of zirconium, hafnium, lanthanum, or gadolinium.

6. The method of claim 1, wherein heating is conducted in an atmosphere of one or more of nitrogen, helium, neon, argon, xenon, or oxygen.

7. The method of claim 2, wherein the first thickness of the high-K gate dielectric of the first set of transistors is about 0.1 nm greater than the second thickness of the high-K gate dielectric of the second set of transistors.

8. A method of making an integrated circuit with multiple thickness high-K gate dielectric layers, comprising:
   forming a conventional gate dielectric layer having a first thickness in a first portion of a substrate, a second thickness in a second portion of the substrate, and a third thickness in a third portion of the substrate, the first thickness greater than the second thickness and the second thickness greater than the third thickness;
   forming a layer of high-K atoms over the conventional gate dielectric;
   heating the layer of high-K atoms, the conventional gate dielectric layer, and the substrate to form a high-K gate dielectric layer, the high-K gate dielectric layer having a first thickness in the first portion, a second thickness in the second portion, and a third thickness in the third portion, the first thickness greater than the second thickness and the second thickness greater than the third thickness.

9. The method of claim 8 further comprising:
   forming a first set of transistors in the first portion of the substrate, a second set of transistors in the second portion of the substrate, and a third set of transistors in the third portion of the substrate, the first set of transistors comprising a high-K gate dielectric of a first thickness, the second set of transistors comprising a high-K gate dielectric of a second thickness, and the third set of transistors comprising a high-K gate dielectric of a third thickness, the first thickness greater than the second thickness and the second thickness greater than the third thickness.

10. The method of claim 8, wherein forming the layer of high-K atoms comprises sputtering one or more of zirconium, hafnium, lanthanum, or gadolinium.

11. The method of claim 8, wherein heating is conducted at a temperature from about 850° C. to about 1100° C. for a time from about 5 seconds to about 2 minutes.

12. The method of claim 8, wherein heating is conducted at a pressure from about 0 atmospheres to about 1.2 atmospheres.

13. The method of claim 8, wherein the layer of high-K atoms has a thickness from about 0.1 nm to about 25 nm.

14. The method of claim 9, wherein the first thickness of the high-K gate dielectric of the first set of transistors is about 0.1 nm greater than the second thickness of the high-K gate dielectric of the second set of transistors, and the second thickness of the high-K gate dielectric of the second set of transistors is about 0.1 nm greater than the third thickness of the high-K gate dielectric of the third set of transistors.

15. An integrated circuit, comprising:
a first set of transistors over a first portion of a substrate, a second set of transistors over a second portion of the substrate;
each of the first set of transistors comprising a gate, a high-K gate dielectric, and a conventional gate dielectric and each of the second set of transistors comprising a gate, a high-K gate dielectric, and optionally a conventional gate dielectric;
the first set of transistors comprising a high-K gate dielectric of at least one of a first thickness or a first composition, and the second set of transistors comprising a high-K gate dielectric of at least one of a second thickness or a second composition, the first thickness greater than the second thickness and the first composition different from the second composition;
the high-K gate dielectric of the first set of transistors and the second set of transistors comprises one or more of $Hf_xSi_{1-x}O_2$, $Hf_xSi_{1-x}ON$, $Zr_xSi_{1-x}O_2$, $Zr_xSi_{1-x}ON$, $La_xSi_{1-x}O_2$, $La_xSi_{1-x}ON$, $Gd_xSi_{1-x}O_2$, or $Gd_xSi_{1-x}ON$, where x is between 0 and 1;
a third set of transistors in a third portion of the substrate;
each of the second set of transistors comprising a gate, a high-K gate dielectric, and optionally a conventional gate dielectric; and
the third set of transistors comprising a high-K gate dielectric of a third thickness, the second thickness greater than the third thickness.

16. The integrated circuit of claim 15, wherein the high-K gate dielectric of the first set of transistors have a thickness from about 0.25 nm to about 20 nm and the high-K gate dielectric of the second set of transistors have a thickness from about 0.25 nm to about 20 nm.

17. The integrated circuit of claim 15, wherein the high-K gate dielectric of the first set of transistors and the second set of transistors comprises $Hf_xSi_{1-x}O_2$ or $Hf_xSi_{1-x}ON$, where x is between 0 and 1; and the first thickness of the high-K gate dielectric of the first set of transistors is at least about 0.25 nm greater than the second thickness of the high-K gate dielectric of the second set of transistors.

18. The integrated circuit of claim 15, wherein the conventional gate dielectric of the first set of transistors has a first thickness and the conventional gate dielectric of the second set of transistors has a second thickness, the first thickness greater than the second thickness.

19. The integrated circuit of claim 15, wherein the conventional gate dielectric of the first set of transistors comprises silicon dioxide or silicon oxynitride.

20. The integrated circuit of claim 15, wherein the integrated circuit is an LSI or a VLSI.

21. A method of suppressing gate leakage current while simultaneously mitigating mobility degradation, comprising using the integrated circuit of claim 15.

* * * * *